United States Patent [19]

Bradford et al.

[11] Patent Number: 4,942,380
[45] Date of Patent: Jul. 17, 1990

[54] HOUSING ASSEMBLY HAVING FLEXIBLE SHIELD AND INSULATOR

[75] Inventors: William M. Bradford, Ft. Lauderdale; Lloyd W. Silvern, Coral Springs; Gerard A. Dennis, Ft. Lauderdale, all of Fla.

[73] Assignee: Motorola, Inc., Schaumburg, Ill.

[21] Appl. No.: 299,205

[22] Filed: Jan. 23, 1989

[51] Int. Cl.$^5$ ............................................... H01F 7/00
[52] U.S. Cl. ................................ 335/301; 174/356 C; 361/399
[58] Field of Search ............................ 335/301, 397, ; 361/398, 399; 174/35 R, 356 C

[56] References Cited

U.S. PATENT DOCUMENTS

| | | | |
|---|---|---|---|
| 4,226,491 | 10/1980 | Kazama et al. | 361/399 X |
| 4,750,089 | 6/1988 | Derryberry et al. | 361/398 |
| 4,831,498 | 5/1989 | Baba | 361/399 X |
| 4,832,609 | 5/1989 | Chung | 361/398 X |

*Primary Examiner*—George Harris
*Attorney, Agent, or Firm*—Robert S. Babayi

[57] ABSTRACT

A electromagnetically shielded and insulated housing assembly (500) is provided having a housing member (200) and a flexible member (100). The housing member has an open side (240) and enclosing sides (215). The flexible member has a layer (110,180,185) of conductive material disposed on selected areas of each opposing side (150,155). The conductive areas are electrically connected by a plurality of conductive feed-throughs (120,115). One side of the flexible member also has adhesive areas (130,125), which are separated from the conductive area. The conductive area of the flexible member is placed over the open side of the housing member and covers it, and thereby electrical contact between the housing and the peripheral edges (250) of the open side is produced. Upward folding of the flexible member bonds the adhesive areas to the opposed enclosing sides of the housing. The other side of the flexible member is connected to a main ground, thereby electromagnetically shielding the housing assembly.

11 Claims, 4 Drawing Sheets

HOUSING ASSEMBLY HAVING FLEXIBLE SHIELD AND INSULATOR

BACKGROUND OF THE INVENTION

The present invention relates generally to electromagnetic shielding, and more particularly to shielding electronic modules used in small, high density applications.

In a portable, two-way radio, modules provide a particular advantage in reducing the size of the unit. In order to minimize the space required, a number of components are placed in a module which typically contain a portion of the transmitter or receiver sections. A number of modules are situated on a main printed circuit (PC) board such that electrical connection between the modules is provided.

Each module generally includes a circuit board, which is enclosed in a housing having an open side to allow modules to be inserted. The connection between the module circuit board and the main printed circuit board is achieved by inserting contact pins from the module's circuit board into sockets located on the main PC board. The module's housing is generally made of conductive material, and forms part of the grounding circuit for the module.

It is known that external radio frequency interference (RFI) and/or electromagnetic interference (EMI) can degrade performance of electronic communication devices. RF interference becomes a problem especially in frequency synthesized communication equipment, wherein the synthesizer circuitry itself may become the source of interference. In order to reduce effect of the RFI, each module must be properly shielded. Accordingly, providing a grounded surface on the open side of the housing greatly improves the shielding. Presently a grounded, thin metal sheet is placed on the main PC board directly under the open side of the housing. The metal sheet connects at the periphery of the open side of the housing thereby electrically coupling the ground plane of the main PC board to the housing.

Another factor affecting performance of a frequency synthesized communication device is microphonics. Microphonics is a phenomena wherein mechanical movements of ground planes induce an audible tone in the speaker of the device. Since the housing constitutes part of the ground path of each module, any mechanism causing motion in the adjacent modules may produce microphonics. These movements can be invoked by compressing, squeezing or simply moving the device. Presently a number of insulators are placed between adjacent modules, thus separating the ground planes and minimizing microphonics.

Contemporary shielding and insulating methods offer some disadvantages since they require numerous undesired and difficult hand-placement operations in the manufacturing process. A high number of insulators and shielding materials is needed to produce the desired results. Additionally, a great degree of variability in shielding quality is observed.

SUMMARY OF THE INVENTION

It is the objective of the invention to provide a flexible shielded housing assembly.

It is another objective of the invention to provide insulation for a shielded housing assembly.

It is another objective of the invention to reduce the number of parts required for shielding and insulating of a housing assembly.

It is still another objective of the invention to facilitate assembly of a shielded housing assembly.

In practicing the invention, a conductive housing member is coupled to a flexible member to produce a module housing assembly for connection to a main PC board. The main PC board receives a plurality of modules and provides interconnecting circuitry and the main ground plane. The housing member includes enclosing sides and an open side. The flexible member, has a front and a rear opposing surfaces, and includes a conductive layer disposed on these surfaces. The open side of the housing member is covered by the conductive area of the flexible member so as to provide electrical contact. A plurality of conductive feed-through (i.e., plated holes) connect the front surface conductive layer to the conductive layer on the rear surface, which is coupled to main ground plane. Thus, a path is provided between the conductive housing and main ground planes, thereby electromagnetically shielding the housing assembly.

The front surface of flexible member may also include adhesive areas spaced apart from and not overlapping the conductive area. In this way, the flexible member may be folded such that a bond is produced between adhesive areas and the housing sides, thereby insulating such sides. Additionally, in order to provide resiliency and improving the ground contacts, foam may be placed between the rear surface of flexible member and the main PC board such that electrical contacts are preserved.

DETAILED DESCRIPTION OF PREFERRED EMBODIMENT

Figure 1:
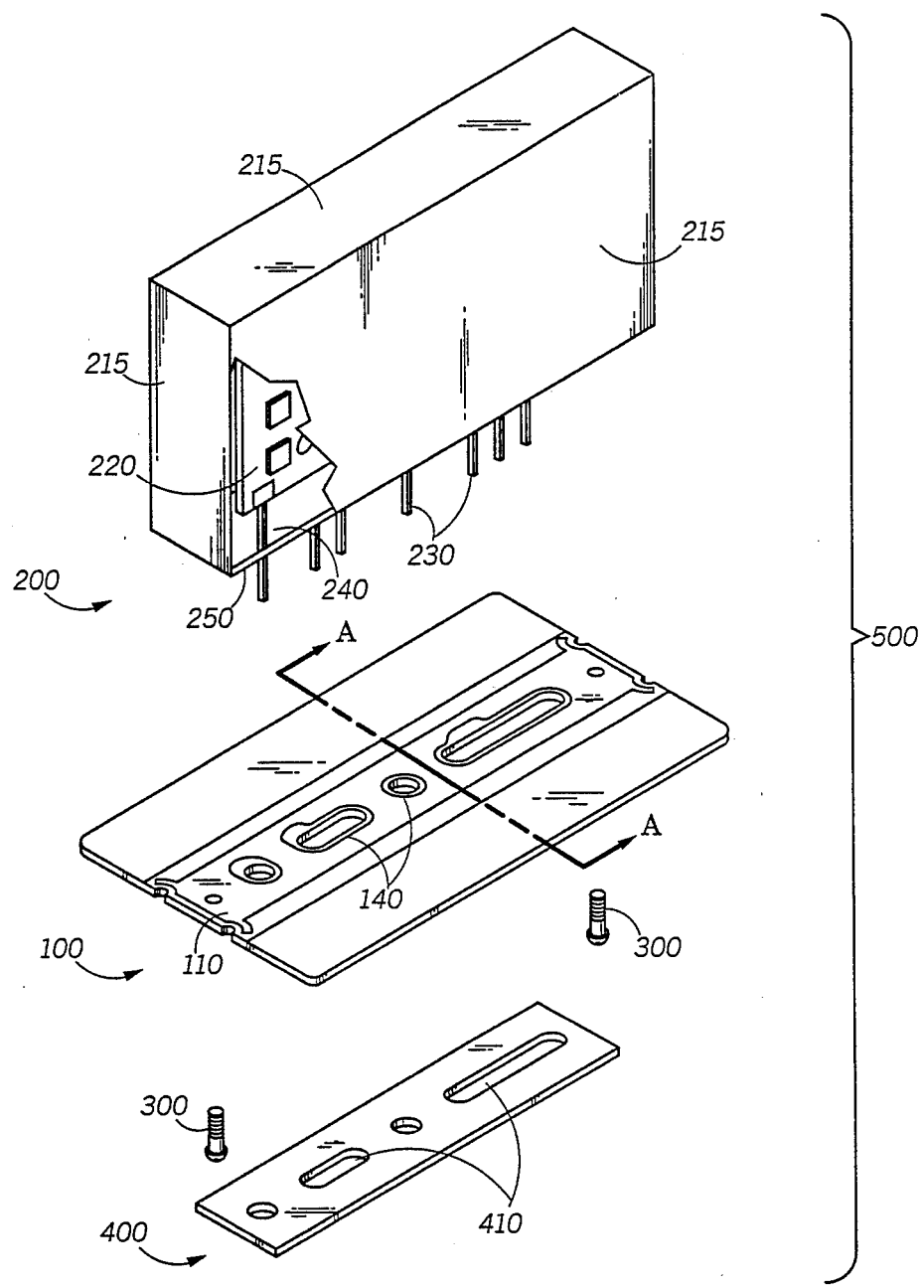
FIG. 1 is an exploded view of a shielded and insulated housing assembly according to the present invention.

Now referring to FIG. 1, an exploded view of a shielded and insulated housing assembly 500 is illustrated.

The housing member 200 includes five enclosing sides 215 (three shown) and an open side 240. The housing member 200 receives a printed circuit board 220, which contains the circuitry of a voltage controlled oscillator (VCO), that may be used in a main unit (not shown), such as, a portable, two-way radio. The circuitry of the VCO is susceptible to RF interference, and failure to properly shield the circuitry may cause functional problems such as frequency instability in the transmitter of the main unit.

The flexible member 100 includes a conductive layer 110 having insulated apertures 140. The present invention provides, a substantially RFI shielded housing assembly 500 by placing the flexible member 100 over the open side 240, such that, layer 110 and peripheral edges 250 are electrically coupled, and the open surface is substantially covered.

The open side 240 allows contact pins 230 of the PC board 220 to pass through insulated apertures 140, and extend below the housing. Pins 230 serve to provide electrical contact, and are received by the main unit's PC board (not shown), which also contains the ground plane of the main unit.

Figure 2:
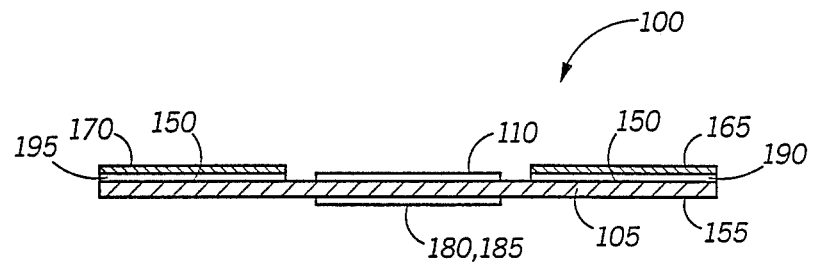
FIG. 2 is the cross-sectional view of the flexible member according to the present invention taken along line A—A.

Referring to FIG. 2, the flexible member 100 is a flexible sheet 105 made of suitable material such as Kapton TM. The flexible member 100 has a front surface 150, and a rear surface 155. The front surface includes adhesive layers 190 and 195, which are protected by paper liners 165 and 170. The front surface 150 and rear surface 155 also include the conductive layers 110, 180, and 185, which comprise gold plated copper in the preferred embodiment, disposed on selected areas.

Figure 3:
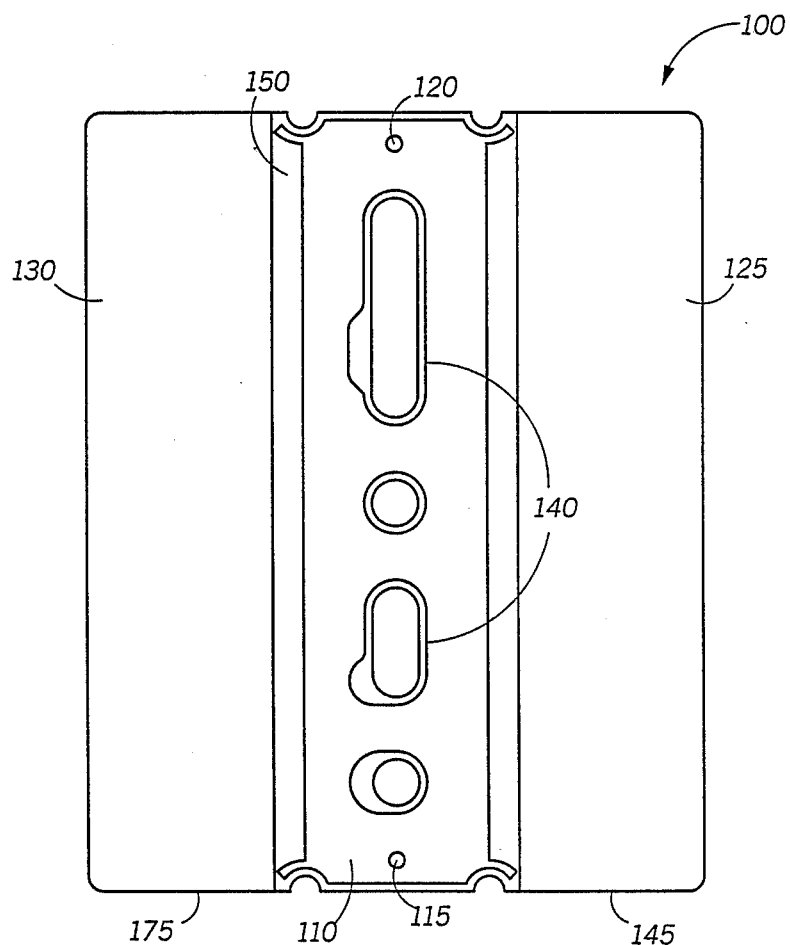
FIG. 3 is the front side view of the flexible member assembly shown in FIG. 2.

Referring to FIG. 3, adhesives are disposed on predetermined areas 130 and 125 of front surface 150 and are separated from the conductive layer 110. Adhesive areas 130 and 125 are preferably transfer tape 3M#468 TM having one side attached to the flexible sheet 105, and the other side covered by paper liners 170 and 165.

Figure 4:
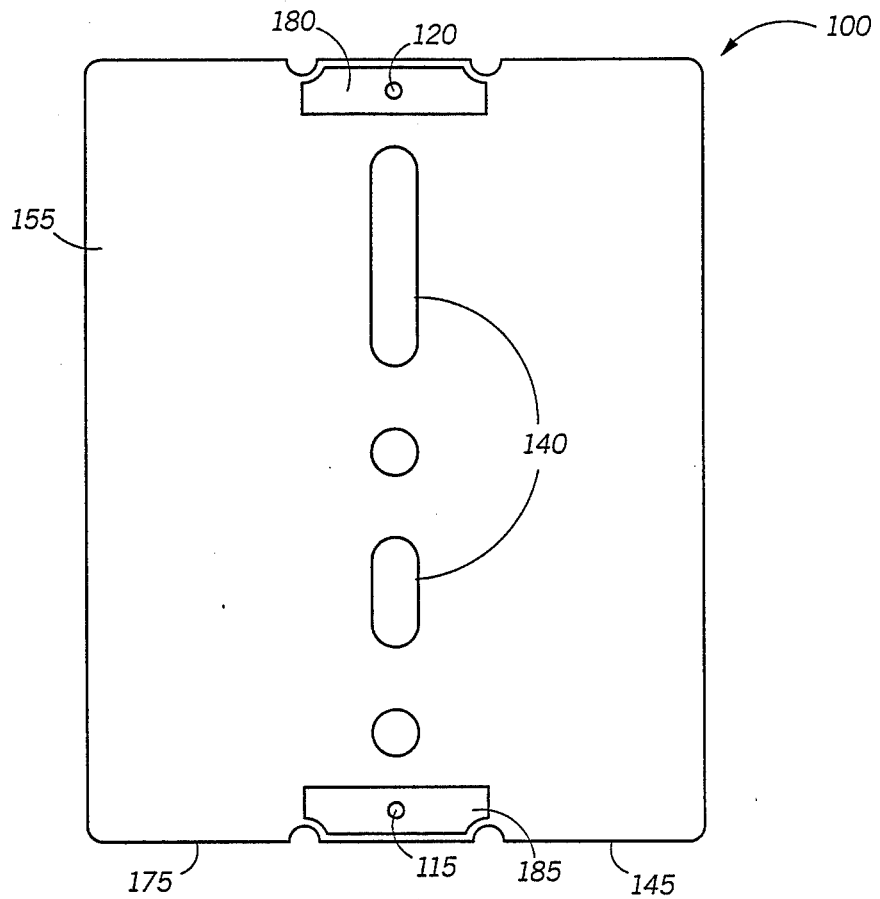
FIG. 4 is the rear side view of the flexible member shown in FIG. 2.

Referring to FIG. 4, the rear surface 155 includes conductive layers 180 and 185, which are positioned directly under the conductive layer 110. Conductive feed-throughs 120 and 115 provide an electrical connection between the front surface 150 and rear surface 155.

Optionally, a piece of closed cell Urethane foam 400 (shown in FIG. 1) may be attached to the rear surface of flexible member 100 so as to not cover layers conductive 180 and 185. The foam 400 includes apertures 410, to allow passage of contact pins 230. The foam 400 provides an elastic mechanism between the housing assembly 500 and the main unit, and improves the ground plane contact when the housing assembly 500 is pressed against the main PC board.

Figure 5A:
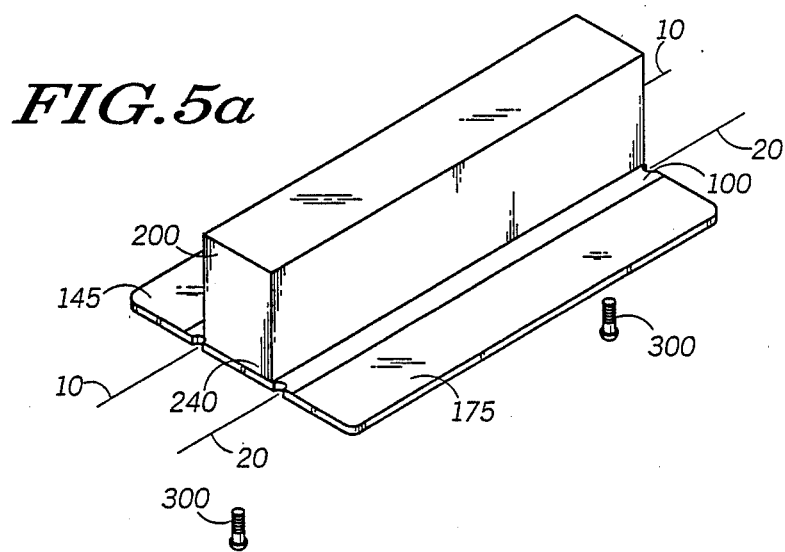
FIGS. 5a, 5b and 5c are perspective views illustrating the steps taken to assemble the invention.
Figure 5B:
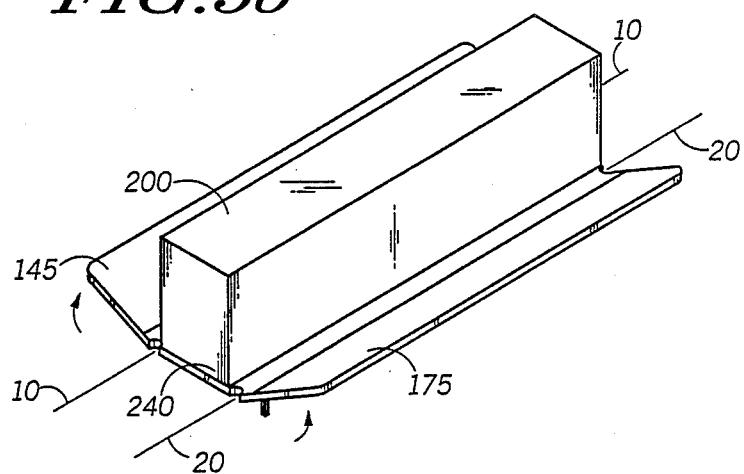
Figure 5C:
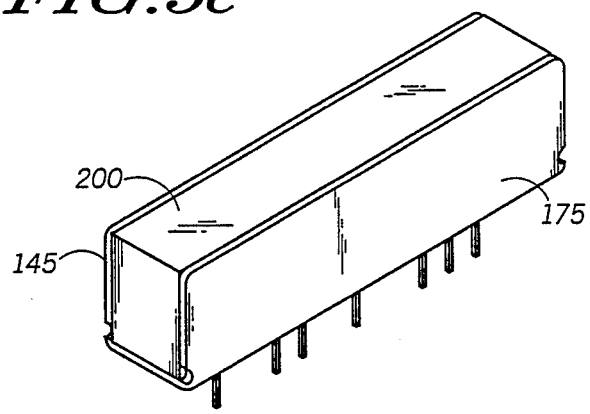

By referring to FIGS. 5a, 5b, and 5c the assembly steps of the invention may be understood. As shown in FIG. 5a, the conductive layer 110 is placed under the open side 240 such that substantial contact is made with peripheral edges of the open side 240. Feed-throughs 115 and 120 electrically couple conductive layer to conductive layers 180 and 185. The layers 180 and 185 contact the ground plane of the main PC board (not shown) and provide a common ground for the housing assembly 500 and the main unit. Metal screws 300 may pass through the feed-throughs 115 and 120 to further improve bonding and electrical connection of ground planes.

Referring to FIG. 5b, insulation of the opposed enclosing sides 215 of the housing assembly 500 is achieved by upwardly folding portions 145 and 175 of flexible member 100 along line 10—10 and line 20—20. Removing protective liners 165 and 170 allows adhesive bonding to be made between portions 145 and 175 of the flexible member 100, and the housing member 200.

FIG. 5c shows the final structure of the housing assembly 500 and printed circuit 220 as an integral module. The insulation provided by portions 145 and 175 minimizes microphonics effects produced by movement of adjacent modules in the main unit.

The above invention offers numerous improvement in manufacturing process of shielded housing assemblies over the prior techniques. The shielding process can become automated using appropriate tooling and eliminating laborious hand-placement operations. The flexible member 100 may be readily produced utilizing current flexible circuit board fabrication methods. Dimensional tolerances of the module is improved due to minimum variation in the flexible members dimensions. Also, only one part is required to provide shielding and insulation for a housing assembly. Additionally the entire shielded housing assembly may be electrically tested as an integral module.

We claim as our invention:

1. An electromagnetically shielded housing assembly comprising:
   a substantially rigid housing member having an open side for receiving an electrical circuit;
   a flexible member including conductive material,
   means for affixing said flexible member to said housing member, so as to substantially cover said open side; and provide electrical contact between said flexible member and said housing member.

2. The Assembly according to claim 1, wherein said flexible member includes insulated apertures.

3. The Assembly according to claim 1, wherein said flexible member includes foam attached to said rear surface.

4. The Assembly according to claim 1, wherein said front and rear surfaces include conductive layers disposed on selected areas, and electrical contact means between said front and rear surfaces.

5. The Assembly according to claim 4, wherein said electrical contact means include at least one conductive feed-through aperture.

6. An electromagnetically shielded housing assembly comprising:
   a substantially rigid housing member having an open side for receiving an electrical circuit;
   a flexible member of insulated material having front and rear opposing surfaces, at least one surface having a conductive layer disposed on selected areas,
   means for affixing said flexible member to said housing member, so as to substantially cover said open side; and provide electrical contact between said flexible member and said housing member, wherein said front surface includes adhesive disposed areas, said adhesive disposed areas spaced apart from and not overlapping conductive areas, and folding said flexible member bonds said flexible member to said housing member.

7. An electromagnetically shielded housing assembly comprising:
   a rigid housing member having enclosing sides and an open side;
   a flexible member of insulated material having:
      front surface having a first conductive layer disposed on selected areas;
      an adhesive layer is disposed on predetermined areas of said front surface;
      rear surface having a second conductive layer disposed on selected areas;
      at least one conductive feed through aperture for providing electrical contact between said first and second conductive layers;
   means for affixing said flexible member to said housing assembly, so as to substantially cover said open side and providing an electrical connection;
   foam attached to rear surface of said flexible member.

8. The Assembly according to claim 7, wherein said flexible member includes insulated apertures.

9. The Assembly according to claim 7, wherein said means are at least one metal screw passing through said feed through aperture and becoming engaged with said housing member.

10. Method of shielding and insulating of a housing assembly comprising:
 (a) providing a rigid housing assembly having enclosing sides and an open side;
 (b) providing a flexible member of insulated material having:
  a front surface with a first conductive layer disposed on selected predetermined areas;
  an adhesive layer disposed on selected areas of front surface;
  a rear surface with a second conductive layer disposed on selected areas;
  means for achieving electrical contact between said first and second conductive layers;
 (c) providing means for affixing said flexible member to said housing assembly, thereby covering said open side and producing an electrical contact therebetween;
 (d) folding of said flexible member thereby bonding said adhesive areas to at least one of said enclosing sides.

11. The assembly of claim 1, wherein said conductive member comprises of flexible insulated material having front and rear opposing surfaces, at least one surface having a conductive layer disposed on selected areas.

* * * * *